US011658246B2

(12) United States Patent
Karda et al.

(10) Patent No.: US 11,658,246 B2
(45) Date of Patent: May 23, 2023

(54) DEVICES INCLUDING VERTICAL TRANSISTORS, AND RELATED METHODS AND ELECTRONIC SYSTEMS

(71) Applicant: Micron Technology, Inc., Boise, ID (US)

(72) Inventors: Kamal M. Karda, Boise, ID (US); Ramanathan Gandhi, Boise, ID (US); Yi Fang Lee, Boise, ID (US); Haitao Liu, Boise, ID (US); Durai Vishak Nirmal Ramaswamy, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 16/596,370

(22) Filed: Oct. 8, 2019

(65) Prior Publication Data
US 2020/0111919 A1 Apr. 9, 2020

Related U.S. Application Data

(60) Provisional application No. 62/743,133, filed on Oct. 9, 2018.

(51) Int. Cl.
*H01L 29/786* (2006.01)
*H01L 29/423* (2006.01)
(Continued)

(52) U.S. Cl.
CPC .. *H01L 29/78642* (2013.01); *H01L 21/02178* (2013.01); *H01L 21/02565* (2013.01);
(Continued)

(58) Field of Classification Search
CPC ......... H01L 29/78642; H01L 29/41733; H01L 29/42384; H01L 29/45; H01L 29/66969;
(Continued)

(56) References Cited

U.S. PATENT DOCUMENTS 5,208,476 A 5/1993 Inoue
6,815,805 B2 11/2004 Wimer
(Continued)

FOREIGN PATENT DOCUMENTS

CN 107359168 A 11/2017
JP 2015-111663 A 6/2015
(Continued)

OTHER PUBLICATIONS

International Search Report from International Application No. PCT/US2019/055105, dated Jan. 23, 2020, 3 pages.
(Continued)

*Primary Examiner* — Tong-Ho Kim
(74) *Attorney, Agent, or Firm* — TraskBritt

(57) ABSTRACT

A device comprises a vertical transistor. The vertical transistor comprises a pillar structure, at least one gate electrode, and a dielectric material. The pillar structure comprises a source region, a drain region, and a channel region. The source region and the drain region each individually comprise at least one electrically conductive material configured to inhibit hydrogen permeation therethrough. The channel region comprises a semiconductive material vertically between the source region and the drain region. The at least one gate electrode laterally neighbors the channel region of the semiconductive structure. The dielectric material is laterally between the semiconductive structure and the at least one gate electrode. Additional devices, and related electronic systems and methods are also disclosed.

18 Claims, 14 Drawing Sheets

(51) Int. Cl.
   *H01L 29/45* (2006.01)
   *H01L 29/417* (2006.01)
   *H01L 29/66* (2006.01)
   *H01L 21/02* (2006.01)
   *H01L 21/441* (2006.01)
   *H01L 29/78* (2006.01)

(52) U.S. Cl.
   CPC ...... *H01L 21/441* (2013.01); *H01L 29/41733* (2013.01); *H01L 29/42384* (2013.01); *H01L 29/45* (2013.01); *H01L 29/66969* (2013.01); *H01L 29/7827* (2013.01); *H01L 29/7869* (2013.01); *H01L 29/78618* (2013.01); *H01L 29/78696* (2013.01)

(58) Field of Classification Search
   CPC ........... H01L 29/7827; H01L 29/78618; H01L 29/7869; H01L 29/78696; H01L 21/02178; H01L 21/02565; H01L 21/441
   USPC .......................................................... 257/43
   See application file for complete search history.

(56) References Cited

U.S. PATENT DOCUMENTS

| | | | |
|---|---|---|---|
| 6,864,191 | B2 | 3/2005 | Yoon |
| 7,605,007 | B2 | 10/2009 | Wang |
| 8,617,953 | B2 | 12/2013 | Juengling |
| 8,748,962 | B2 | 6/2014 | Wang |
| 8,772,771 | B2 | 7/2014 | Tanaka |
| 9,136,282 | B2 | 9/2015 | Qin et al. |
| 9,373,715 | B2 | 6/2016 | Mueller et al. |
| 9,685,215 | B1 | 6/2017 | Kang et al. |
| 9,698,272 | B1 | 7/2017 | Ikeda et al. |
| 2007/0148939 | A1 | 6/2007 | Chu et al. |
| 2011/0127522 | A1* | 6/2011 | Yamazaki ......... H01L 21/02565 257/43 |
| 2013/0168756 | A1 | 7/2013 | Hopkins et al. |
| 2014/0197416 | A1 | 7/2014 | Qin et al. |
| 2014/0252350 | A1 | 9/2014 | Kim |
| 2015/0243707 | A1 | 8/2015 | Park |
| 2015/0303217 | A1* | 10/2015 | Tanaka .................. H01L 29/518 257/43 |
| 2015/0364513 | A1 | 12/2015 | Takahashi et al. |
| 2016/0190343 | A1 | 6/2016 | Hou et al. |
| 2016/0284859 | A1* | 9/2016 | Asami ............... H01L 29/42384 |
| 2016/0336333 | A1 | 11/2016 | Nakao |
| 2017/0103889 | A1 | 4/2017 | Chan et al. |
| 2018/0102434 | A1* | 4/2018 | He ....................... H01L 21/467 |
| 2018/0204856 | A1 | 7/2018 | Noh et al. |
| 2019/0019813 | A1 | 1/2019 | Ren et al. |

FOREIGN PATENT DOCUMENTS

| | | | |
|---|---|---|---|
| JP | 2015111663 A | * | 6/2015 |
| JP | 2016-187032 A | | 10/2016 |
| TW | 564547 B | | 12/2003 |
| TW | 201535535 A | | 9/2015 |

OTHER PUBLICATIONS

International Written Opinion from International Application No. PCT/US2019/055105, dated Jan. 23, 2020, 5 pages.
Taiwanese Office Action for Application No. 108136550, dated May 14, 2020, 18 pages.
Correia et al., A Second-Order S? ADC Using Sputtered IGZO TFTs, Chapter 2, Thin-Film Transistors, (2016), pp. 5-15.
Khakani et al., Reactive Pulsed Laser Deposition of Iridium Oxide Thin Films, Thin Solid Films, vol. 335, (1998), pp. 6-12.
Kushida-Abdelghafar et al., Post-Annealing Effects on Anitreduction Characteristics of IrO2/Pb(ZrxTi1-x)O3/Pt Ferroelectric Capacitors, Journal of Applied Physics, vol. 85, No. 2, (Jan. 15, 1999), pp. 1069-1074.
Orouji et al., Leakage Current reduction Techniques in poly-Si TFTs for Active Matrix Liquid Crystal Displays, A Comprehensive Study, IEEE Trans. on Device and Materials Reliability, vol. 6, (Jun. 2006), pp. 315-325.
Vishay Semiconductors, N-Channel Dual Gate MOS-Fieldeffect Tetrode, Depletion Mode, BF995, www.vishay.com, Document No. 85009, (Jan. 20, 1999), 7 pages.
European Partial Search Report for European Application No. 19870314.2, dated Jun. 1, 2022, 16 pages.
Japanese Notice of Reasons for Refusal for Japanese Application No. 2021-519571, dated Jun. 28, 2022, 11 pages with English translation.
Korean Notice of Reasons for Rejection for Korean Application No. 10-2021-7012886, dated Sep. 19, 2022, 14 pages with English translation.
Supplementary European Search Report and Opinion for European Application No. 19870314.2, dated Sep. 2, 2022, 13 pages.

* cited by examiner

DEVICES INCLUDING VERTICAL TRANSISTORS, AND RELATED METHODS AND ELECTRONIC SYSTEMS

CROSS-REFERENCE TO RELATED APPLICATION

This application claims the benefit under 35 U.S.C. § 119(e) of U.S. Provisional Patent Application Ser. No. 62/743,133, filed Oct. 9, 2018, the disclosure of which is hereby incorporated herein in its entirety by this reference.

TECHNICAL FIELD

Embodiments of the disclosure relate to the field of semiconductor device design and fabrication. More specifically, embodiments disclosed herein relate to semiconductor device structures including vertical transistors having materials configured to inhibit the permeation of hydrogen species therethrough, and to related semiconductor devices, electronic systems, and methods.

BACKGROUND

Memory devices are generally provided as internal integrated circuits in computers or other electronic devices. There are many types of memory including, but not limited to, random-access memory (RAM), read-only memory (ROM), dynamic random access memory (DRAM), synchronous dynamic random access memory (SDRAM), Flash memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes at least one access device, such as a transistor, and at least one memory storage structure, such as a capacitor. Modern applications for semiconductor devices can employ significant quantities of memory cells, arranged in memory arrays exhibiting rows and columns of the memory cells.

The capacitor (e.g., sometimes referred to as a "cell capacitor" or a "storage capacitor") is configured to store a logical state (e.g., a binary value of either a "0" or a "1") defined by the storage charge in the capacitor. The transistor may be referred to in the art as an "access transistor." The transistor conventionally includes a channel region between a pair of source/drain regions and further includes a gate configured to electrically connect the source/drain regions to one another through the channel region. The channel region conventionally includes a semiconductor material, such as silicon.

Conventional processes of forming a conventional memory cell often include performing a hydrogen annealing process wherein one or more features of the memory cell being fabricated is exposed to hydrogen while being annealed at low temperatures (e.g., less than 450° C.). However, during the hydrogen annealing process, hydrogen can diffuse into the channel region of the access device of the memory cell, degrading the performance and/or reliability of the resultant memory device. Accordingly, a need exists for new methods and structures that reduce or even prevent such undesirable hydrogen diffusion.

DETAILED DESCRIPTION

Figure 1:
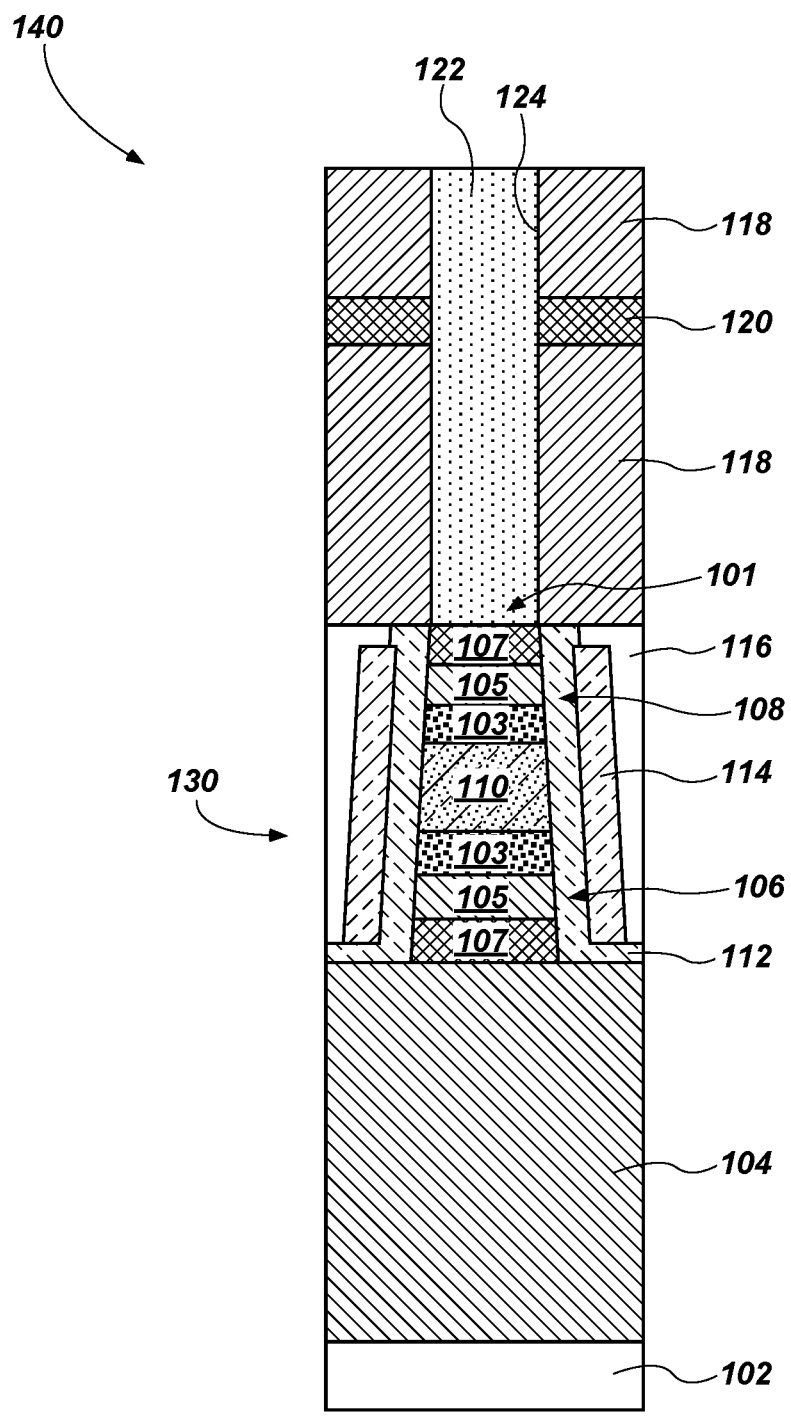
FIG. 1 is a simplified cross-sectional view of a semiconductor device structure, according to embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device structure, a tool used during processing of a semiconductor device structure, or a complete description of a process flow for fabricating a semiconductor device. The structures described below do not form complete semiconductor device structures, or tools or systems for processing semiconductor device structures. Only those process acts and structures necessary to understand the embodiments described herein are described in detail below. Additional acts to form a complete semiconductor device structure or a tool or system for processing a semiconductor device structure may be performed by conventional techniques.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, even at least 99.9% met, or even 100.0% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

FIG. 1 illustrates a simplified, cross-sectional view of a semiconductor device structure 140 in accordance with embodiments of the disclosure. The semiconductor device structure 140 includes a digit line 104 (e.g., data line, bit line) overlying an electrically insulative material 102. The electrically insulative material 102 comprises a material configured to inhibit the permeation of hydrogen into a channel region of a transistor of the semiconductor device structure 140 during a hydrogen anneal step. Accordingly, the electrically insulative material 102 may also be referred to herein as a barrier material. The electrically insulative material 102 may comprise one or more of boron nitride (BN), boron carbon nitride (BCN), silicon alumina nitride (SiAlON), silicon carbide (SiC), silicon carbon nitride (SiCN), silicon nitride (SiN), silicon aluminum nitride (SiAlN), aluminum oxynitride (AlON), and aluminum oxide ($Al_2O_3$). In some embodiments, the electrically insulative material 102 comprises aluminum oxide ($Al_2O_3$).

A vertical transistor 130 overlies the digit line 104. The vertical transistor 130 includes a semiconductive pillar 101 including a drain region 106, a source region 108, and a channel region 110 vertically between the drain region 106 and the source region 108. As shown in FIG. 1, the digit line 104 is in electrical communication with the drain region 106 of the semiconductive pillar 101. In addition, the vertical transistor 130 further includes a gate dielectric material 112 at least partially surrounding lateral surfaces of the semiconductive pillar 101, and one or more gate electrodes 114 (e.g., word lines) laterally adjacent to the gate dielectric material 112. The gate dielectric material 112 may laterally intervene between the gate electrodes 114 and the channel region 110 of the semiconductive pillar 101.

The digit line 104 may comprise an electrically conductive material, such as, for example, tungsten, titanium, nickel, platinum, rhodium, ruthenium, aluminum, copper, molybdenum, iridium, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

The channel region 110 of the semiconductive pillar 101 may comprise a semiconductive material 109 (FIG. 2A) formulated and configured to conduct current responsive to application of a voltage (e.g., a threshold voltage, a set bias voltage, a read bias voltage) to a vertical transistor 130. The channel region 110 may, for example, comprise a semiconductive material having a larger bandgap than polycrystalline silicon, such as a bandgap greater than 1.65 electron-volts (eV). In some embodiments, the channel region 110 comprises an oxide semiconductor material such as, for example, zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_a$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and other similar materials. In some embodiments, the channel region 110 comprises IGZO.

The drain region 106 and the source region 108 of the semiconductive pillar 101 may each individually comprise at least one electrically conductive material. The electrically conductive material may be configured to inhibit permeation of hydrogen therethrough during a hydrogen anneal step. In some embodiments, the drain region 106 and the source region 108 are each substantially homogeneous. For example, the drain region 106 and the source region 108 may each individually be formed of a single (e.g., only one) material having a substantially uniform (e.g., non-variable) composition throughout dimensions (e.g., lateral dimensions, vertical dimensions) thereof. In other embodiments, at least one (e.g., each) of the drain region 106 and the source region 108 is heterogeneous. For example, one or more of the drain region 106 and the source region 108 may have a substantially non-uniform (e.g., variable) material composition throughout dimensions (e.g., lateral dimensions, vertical dimensions) thereof. In some embodiments, one or more of the drain region 106 and the source region 108 comprises a composite structure include a stack (e.g., laminate) of two or more (e.g., three or more) different electrically conductive barrier materials configured to inhibit hydrogen permeation therethrough.

For example, as illustrated in FIG. 1, the drain region 106 and the source region 108 may each individually comprise a stack of electrically conductive materials including a first barrier material 103, a second barrier material 105, and a third barrier material 107. The barrier materials 103, 105, 107 of the drain region 106 may be arranged in a different order from the barrier materials 103, 105, 107 of the source region 108 such that, for example, the barrier materials 103, 105, 107 of the drain region 106 may be arranged in an inverted order relative to the barrier materials 103, 105, 107 of the source region 108, as illustrated in FIG. 1. In additional embodiments, the first, second, and third barrier materials 103, 105, 107 may be arranged in any other order to form the drain region 106 and the source region 108, respectively. In further embodiments, the drain region 106 may comprise one or more barrier materials not included in the source region 108, or vice versa. In some embodiments, the first barrier material 103 comprises elemental iridium (Ir), the second barrier material 105 comprises iridium oxide ($IrO_2$), and the third barrier material 107 comprises titanium aluminum nitride (TiAlN). In other embodiments, one or more of the drain region 106 and the source region 108 is heterogeneous and comprises a stack including elemental iridium (Ir) and iridium oxide ($IrO_2$). In further embodiments, one or more of the drain region 106 and the source region 108 is substantially homogeneous and comprises titanium aluminum nitride (TiAlN).

Each of the drain region 106 and the source region 108 may be formed to respective thicknesses within a range of from about 20 Å to about 550 Å, such as from about 50 Å to about 250 Å, or from about 50 Å to about 100 Å. In some embodiments, the drain region 106 and the source region 108 are formed to have different thicknesses than one another. In other embodiments, the drain region 106 and the source region 108 are formed to the same thickness.

The gate dielectric material 112 may comprise one or more electrically insulative materials, such as phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN)), a dielectric carboxynitride material (e.g., silicon carboxynitride (SiOCN)), another material, or combinations thereof.

A gate electrode material 113 (FIG. 2C) may comprise one or more electrically conductive materials, such as, for example, tungsten, titanium, nickel, platinum, ruthenium, aluminum, copper, molybdenum, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide ($IrO_x$), ruthenium oxide ($RuO_x$), elemental tungsten (W), elemental aluminum (Al), elemental copper (Cu), elemental gold (Au), elemental silver (Ag), polysilicon, alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof.

As shown in FIG. 1, another electrically insulative material 116 may at least partially surround lateral surfaces of the gate electrodes 114 and the gate dielectric material 112. The electrically insulative material 116 may fill spaces between adjacent gate electrodes 114 of adjacent vertical transistors 130. In some embodiments, the electrically insulative material 116 comprises the same material composition as the electrically insulative material 102 and the gate dielectric material 112. In other embodiments, one or more of the electrically insulative material 116, the electrically insulative material 102, and the gate dielectric material 112 comprises a different material composition than one or more other of the electrically insulative material 116, the electrically insulative material 102, and the gate dielectric material 112.

As shown in FIG. 1, in some embodiments, a first portion of another electrically insulative material 118 overlies the vertical transistor 130, another electrically insulative material 120 overlies the electrically insulative material 118, and a second portion of the another electrically insulative material 118 overlies the another electrically insulative material 120. In other embodiments, the first portion of the another electrically insulative material 118 is omitted. For example, the additional electrically insulative material 120 may overlie the vertical transistor 130, and an entirety of the another electrically insulative material 118 overlies the additional electrically insulative material 120. The additional electrically insulative material 120 may comprise a barrier material configured to inhibit permeation of hydrogen therethrough during a hydrogen anneal step. A material composition of the additional electrically insulative material 120 may be substantially the same as or may be different than that of the electrically insulative material 102. Accordingly, the channel region 110 of the semiconductive pillar 101 of the vertical transistor 130 may be surrounded by (e.g., encapsulated) and substantially protected against permeation of hydrogen species by the drain region 106 and the source region 108 of the semiconductive pillar 101, as well as the electrically insulative material 102, and the additional electrically insulative material 120.

With continued reference to FIG. 1, the semiconductor device structure 140 may further include a conductive material 122 (e.g., a conductive contact material) filling an opening 124 extending through the another electrically insulative material 118 and the additional electrically insulative material 120. The conductive material 122 may, for example, electrically couple the source region 108 of the vertical transistor 130 to a conductive line structure (e.g., a source line).

Thus, in accordance with embodiments of the disclosure, a device comprises a vertical transistor. The vertical transistor comprises a pillar structure, at least one gate electrode, and a dielectric material. The pillar structure comprises a source region, a drain region, and a channel region. The source region and the drain region each individually comprise at least one electrically conductive material configured to inhibit hydrogen permeation therethrough. The channel region comprises a semiconductive material vertically between the source region and the drain region. The at least one gate electrode laterally neighbors the channel region of the semiconductive structure. The dielectric material is laterally between the semiconductive structure and the at least one gate electrode.

Figure 2A:
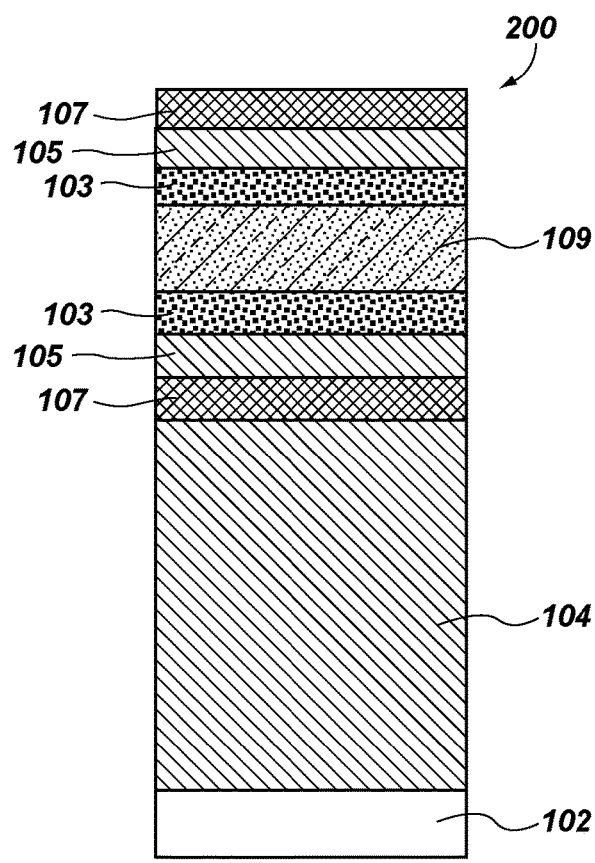
FIGS. 2A through 2F are simplified cross-sectional views illustrating various stages of a method of forming the semiconductor device structure of FIG. 1.

FIGS. 2A through 2F illustrate various stages of a fabrication process to form the semiconductor device structure 140 shown in FIG. 1, according to some embodiments of the disclosure. Referring to FIG. 2A, a stack structure 200 may be formed to include the electrically insulative material 102, the digit line 104 over the electrically insulative material 102, one or more (e.g., each) of the electrically conductive barrier materials 103, 105, 107 to form the drain region 106 (FIG. 1) over the electrically insulative material 102, a semiconductive material 109 to become the channel region 110 (FIG. 1) over the electrically conductive barrier materials 103, 105, 107, and additional amounts of one or more (e.g., each) of the electrically conductive barrier materials 103, 105, 107 over the semiconductive material 109 to form the source region 108 (FIG. 1).

Figure 2B:
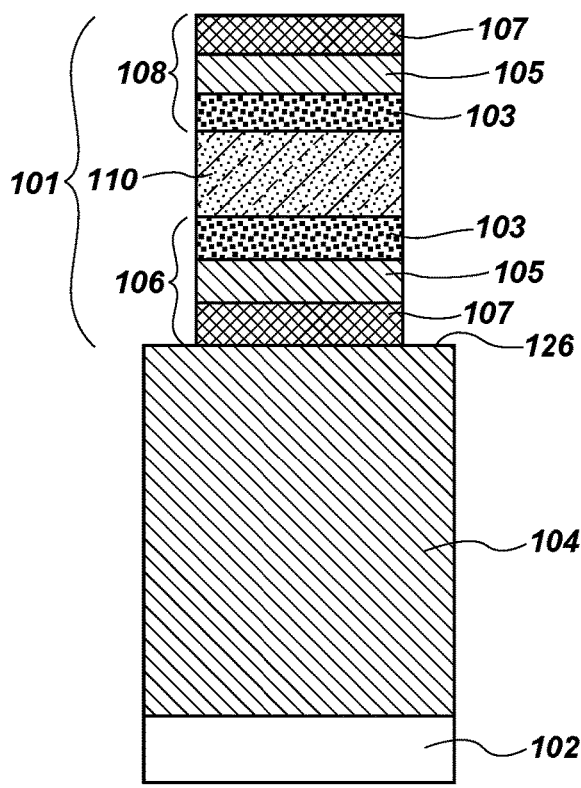

Referring to FIG. 2B, the stack structure 200 (FIG. 2A) is subjected to at least one material removal process (e.g., at least one etching process) to form the semiconductive pillar 101 including the drain region 106, the channel region 110, and the source region 108. As shown in FIG. 2B, the material removal process may expose an upper surface 126 of the digit line 104.

Figure 2C:
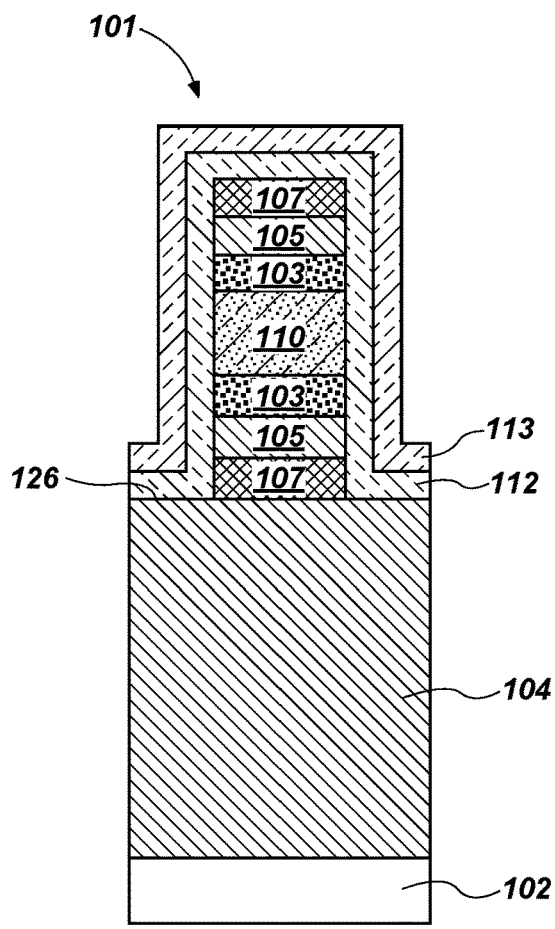

Referring next to FIG. 2C, the gate dielectric material 112 may be formed (e.g., conformally formed) over the upper surface 126 of the digit line 104 and surfaces (e.g., upper surfaces, side surfaces) of the semiconductive pillar 101. The gate dielectric material 112 may be formed by, for example, atomic layer deposition (ALD), chemical vapor deposition (CVD), physical vapor deposition (PVD), low pressure chemical vapor deposition (LPCVD), plasma-enhanced chemical vapor deposition (PECVD), another deposition method, or combinations thereof. After forming the gate dielectric material 112, a gate electrode material 113 to become the gate electrodes 114 (FIG. 1) may be formed over at least a portion of the gate dielectric material 112.

Figure 2D:
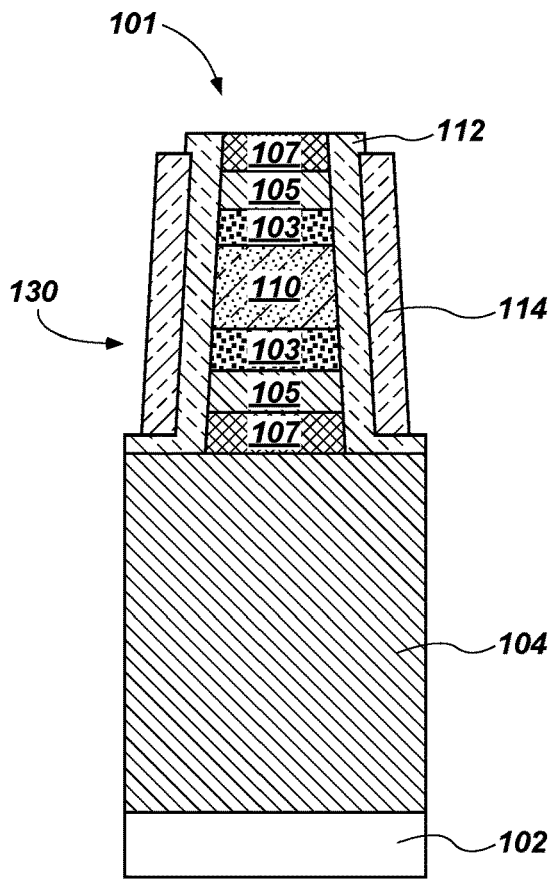

With reference to FIG. 2D, the gate electrode material 113 (FIG. 2C) and the gate dielectric material 112 may be patterned to form the vertical transistor 130 including the semiconductive pillar 101, the gate dielectric material 112, and the gate electrodes 114. The gate dielectric material 112 and the gate electrode material 113 (FIG. 2C) may be patterned using conventional processes (e.g., chemical mechanical planarization processes, etching processes), which are not described in detail herein.

Figure 2E:
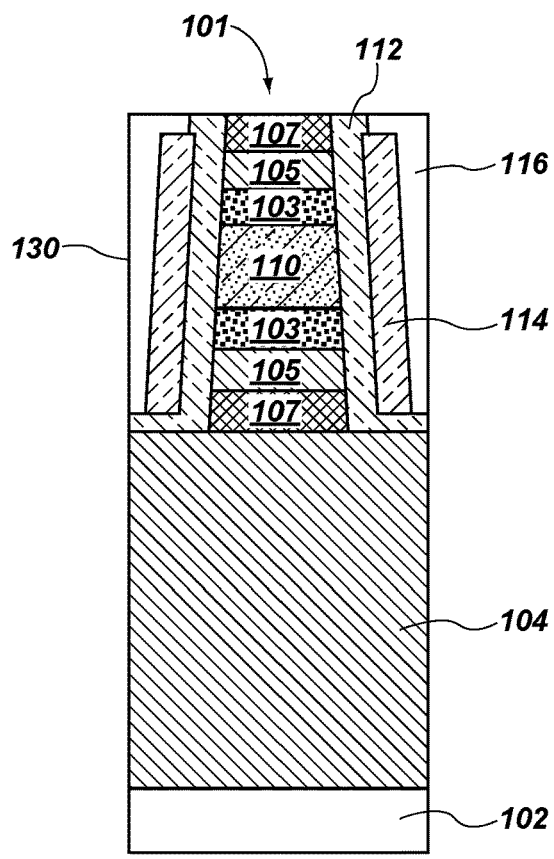

Referring next to FIG. 2E, the electrically insulative material 116 may be formed over at least a portion of the gate electrodes 114 and the gate dielectric material 112. The electrically insulative material 116 may fill spaces between adjacent gate electrodes 114 of adjacent vertical transistors 130. The electrically insulative material 116 may be formed using conventional processes (e.g., conventional material deposition processes, conventional chemical mechanical planarization (CMP) processes), which are not described in detail herein.

Figure 2F:
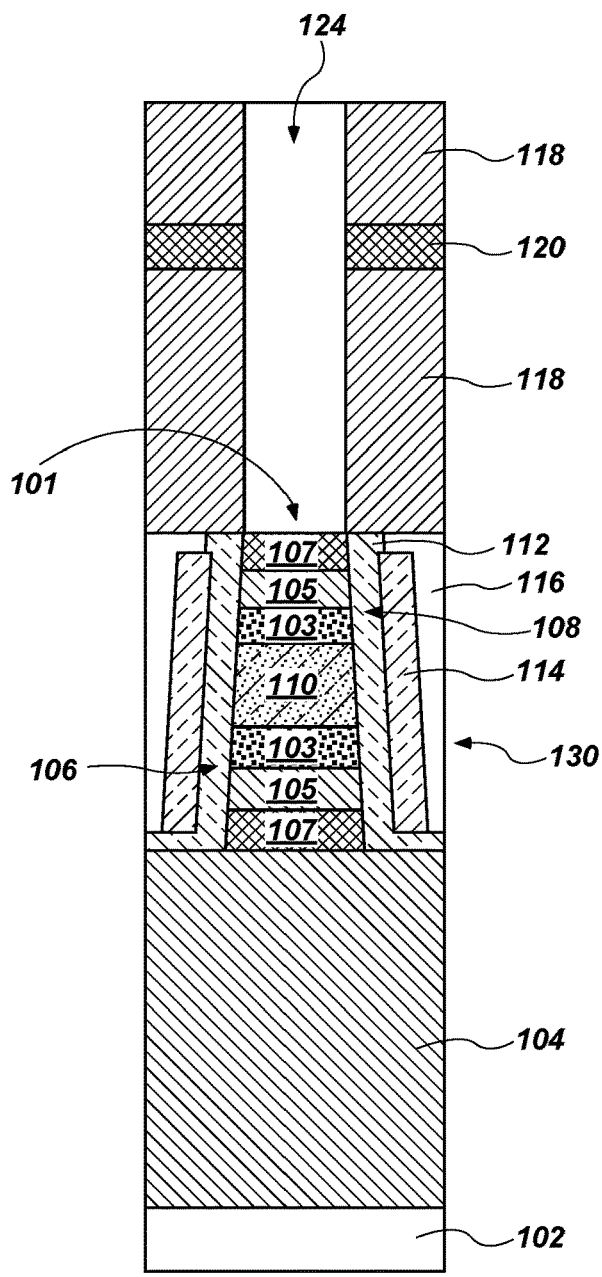

Referring next to FIG. 2F, the another electrically insulative material 118 and the additional electrically insulative material 120 may be formed (e.g., deposited) over the vertical transistor 130 and the electrically insulative material 116, and then portions of the electrically insulative material 118 and the additional electrically insulative material 120 may be selectively removed to form an opening 124. The opening 124 may then be filled with the conductive material 122 (FIG. 1) to form the semiconductor device structure 140 (FIG. 1). The another electrically insulative material 118, the additional electrically insulative material 120, and the opening 124 may be formed using conventional processes (e.g., conventional material deposition processes, conventional etching processes), which are not described in detail herein.

Thus, in accordance with embodiments of the disclosure, a method of fabricating a device comprises forming a stack. The stack comprises a first electrically conductive material, a second electrically conductive material over the first electrically conductive material, and a semiconductive material over the second electrically conductive material. The second electrically conductive material is configured to inhibit permeation of hydrogen species therethrough. At least the semiconductive material is patterned to form a pillar structure. A gate dielectric material and a gate electrode are formed to laterally neighbor the semiconductive pillar. The gate dielectric material intervenes between the gate electrode and the pillar structure.

FIGS. 3A through 3G are simplified cross-sectional views illustrating various stages of a fabrication process to form a semiconductor device structure, in accordance with additional embodiments of the disclosure. Throughout the remaining description and the accompanying figures, functionally similar features (e.g., structures, devices) are referred to with similar reference numerals incremented by 100. To avoid repetition, not all features shown in the remaining figures are described in detail herein. Rather, unless described otherwise below, a feature designated by a reference numeral that is a 100 increment of the reference numeral of a previously-described feature (whether the previously-described feature is first described before the present paragraph, or is first described after the present paragraph) will be understood to be substantially similar to the previously-described feature.

Figure 3A:
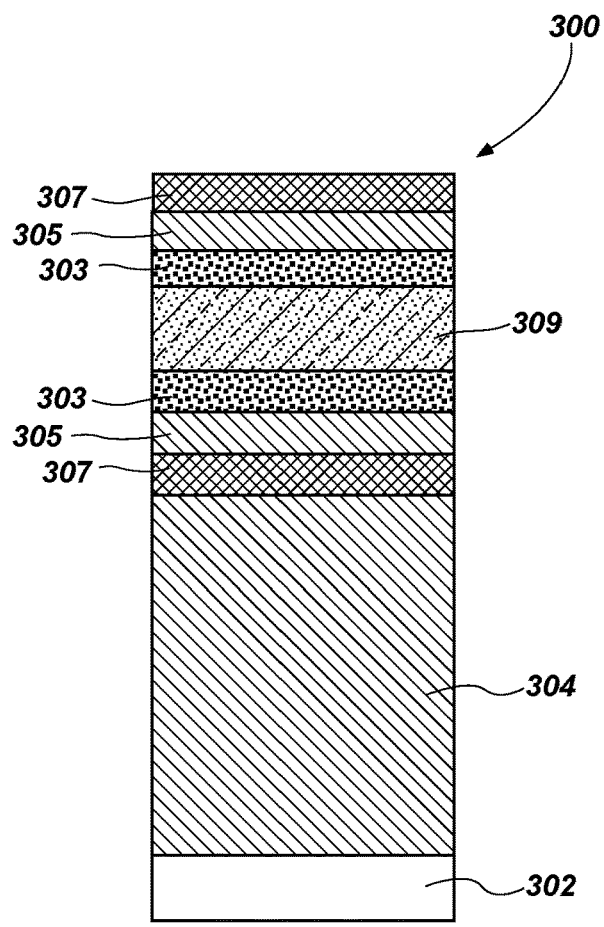
FIGS. 3A through 3G are simplified cross-sectional views illustrating various stages of a method of forming a semiconductor device structure, according to additional embodiments of the disclosure.

Referring to FIG. 3A, a stack 300 of materials is formed to include an electrically insulative material 302, a digit line 304 over the electrically insulative material 302, a drain region 306 including one or more (e.g., each) of electrically conductive barrier materials 303, 305, 307 over the digit line 304, a semiconductive material 309 to form a channel region 310 (FIG. 3B) over the electrically conductive barrier materials 303, 305, 307, and one or more (e.g., each) of electrically conductive barrier materials 303, 305, 307 to form a source region 308 (FIG. 3B) over the semiconductive material 309.

Figure 3B:
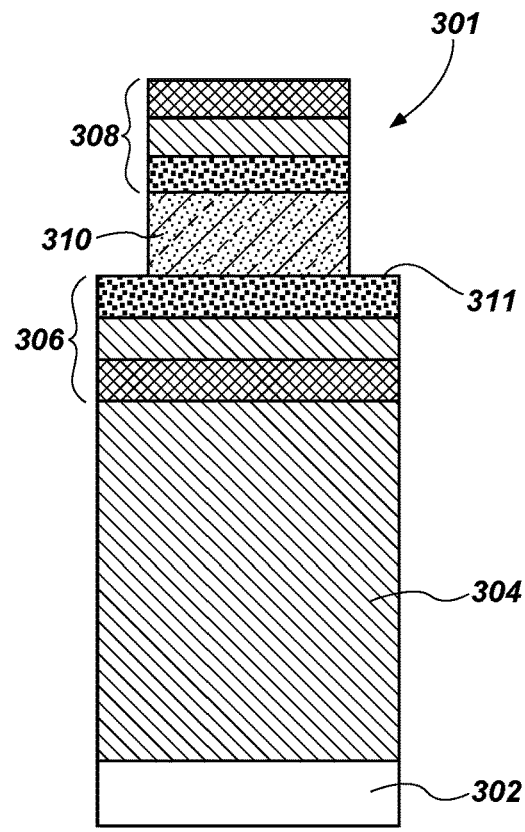

Referring to FIG. 3B, the stack 300 is subjected to at least one material removal process (e.g., at least one etching process) to form a semiconductive pillar 301 comprising a source region 308 and a channel region 310. As shown in FIG. 3B, the material removal process may expose an upper surface 311 of the drain region 306. In some embodiments, the one or more electrically conductive barrier materials 303, 305, 307 of the drain region 306 are substantially maintained over the digit line 304 and are not removed during the removal process. As shown in FIG. 3B, the digit line 304 is in electrical communication with the drain region 306, which extends continuously over the digit line 304.

Figure 3C:
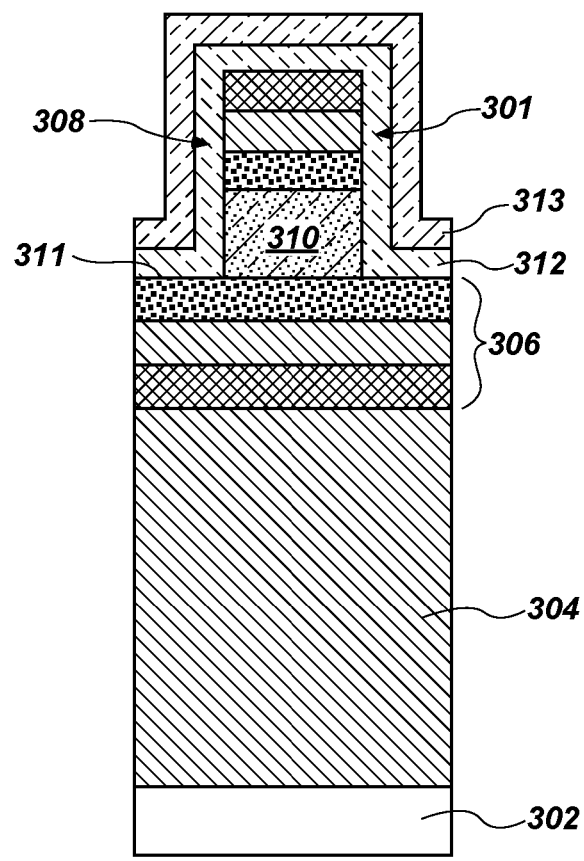

Referring next to FIG. 3C, a gate dielectric material 312 may be formed (e.g., conformally formed) over the upper surface 311 of the drain region 306 and surfaces (e.g., upper surfaces, side surfaces) of the semiconductive pillar 301. After forming the gate dielectric material 312, a gate electrode material 313 to become gate electrodes 314 (FIG. 3D) may be formed (e.g., conformally formed) over at least a portion of the gate dielectric material 312. In some embodiments, the gate dielectric material 312 is formed by one or more deposition processes as previously described with reference to FIG. 2C.

Figure 3D:
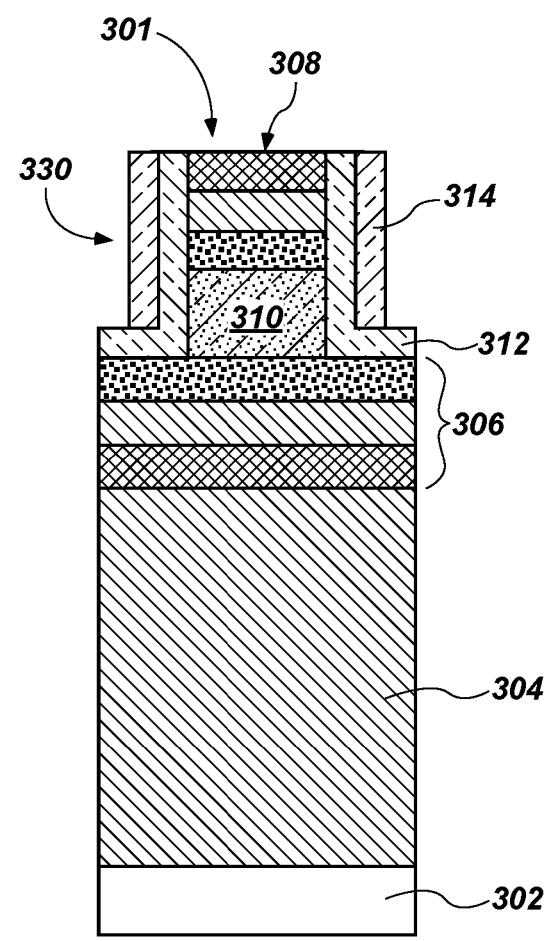

Referring next to FIG. 3D, the gate electrode material 313 (FIG. 3C) and the gate dielectric material 312 may be patterned to form a vertical transistor 330 (FIG. 3E) including the semiconductive pillar 301 (including the source region 308 and the channel region 310) the drain region 306, gate electrodes 314 laterally neighboring the channel region 310 of the semiconductive pillar 301, and the gate dielectric material 312 extending between the gate electrodes 314 and each of the semiconductive pillar 301 and the drain region 306. The gate electrode material 313 and the gate dielectric material 312 may be patterned using conventional processes (e.g., CMP processes, etching processes), which are not described in detail herein.

Figure 3E:
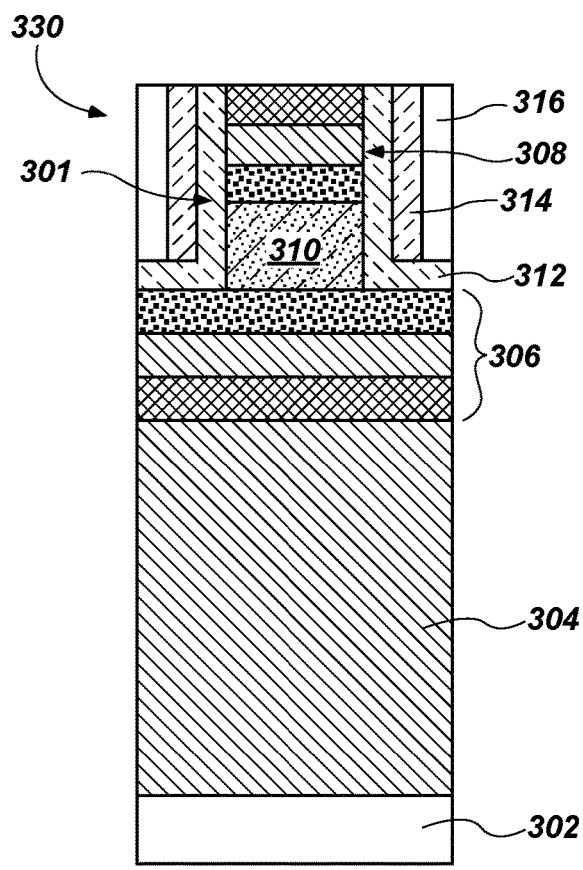

Referring next to FIG. 3E, an electrically insulative material 316 may be formed (e.g., selectively formed) over at least a portion of the gate electrodes 314 and the gate dielectric material 312. The electrically insulative material 316 may fill spaces between adjacent gate electrodes 314 of adjacent vertical transistors. The electrically insulative material 316 may be patterned using conventional processes (e.g., CMP processes, etching processes), which are not described in detail herein.

Figure 3F:
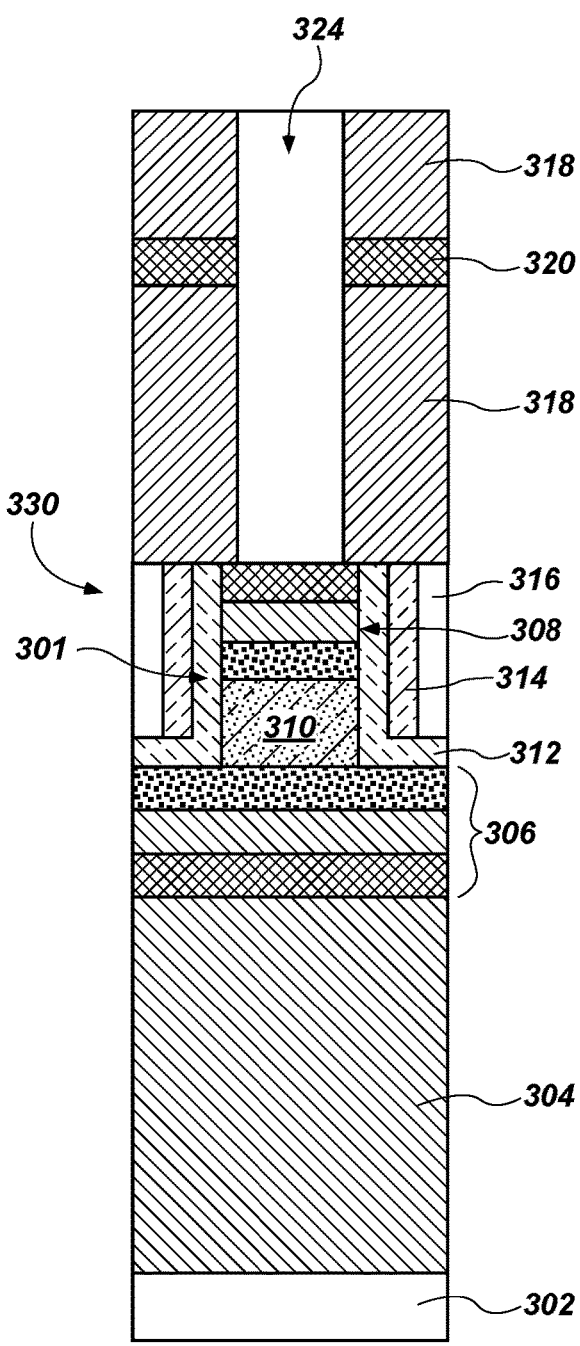

Referring next to FIG. 3F, a first portion of another electrically insulative material 318 may be formed (e.g., deposited) over the vertical transistor 330, an additional electrically insulative material 320 may be formed over the first portion of the another electrically insulative material 318, and a second portion of the another electrically insulative material 318 may be formed the another electrically insulative material 320. In other embodiments, the first portion of the another electrically insulative material 318 is omitted, the additional electrically insulative material 320 may overlie the vertical transistor 330, and an entirety of the another electrically insulative material 318 overlies the additional electrically insulative material 320. The additional electrically insulative material 320 may comprise a barrier material configured to inhibit permeation of hydrogen therethrough during a hydrogen anneal step.

With continued reference to FIG. 3F, at least a portion of the another electrically insulative material 318 and the additional electrically insulative material 320 may be selectively removed to form an opening 324.

Figure 3G:
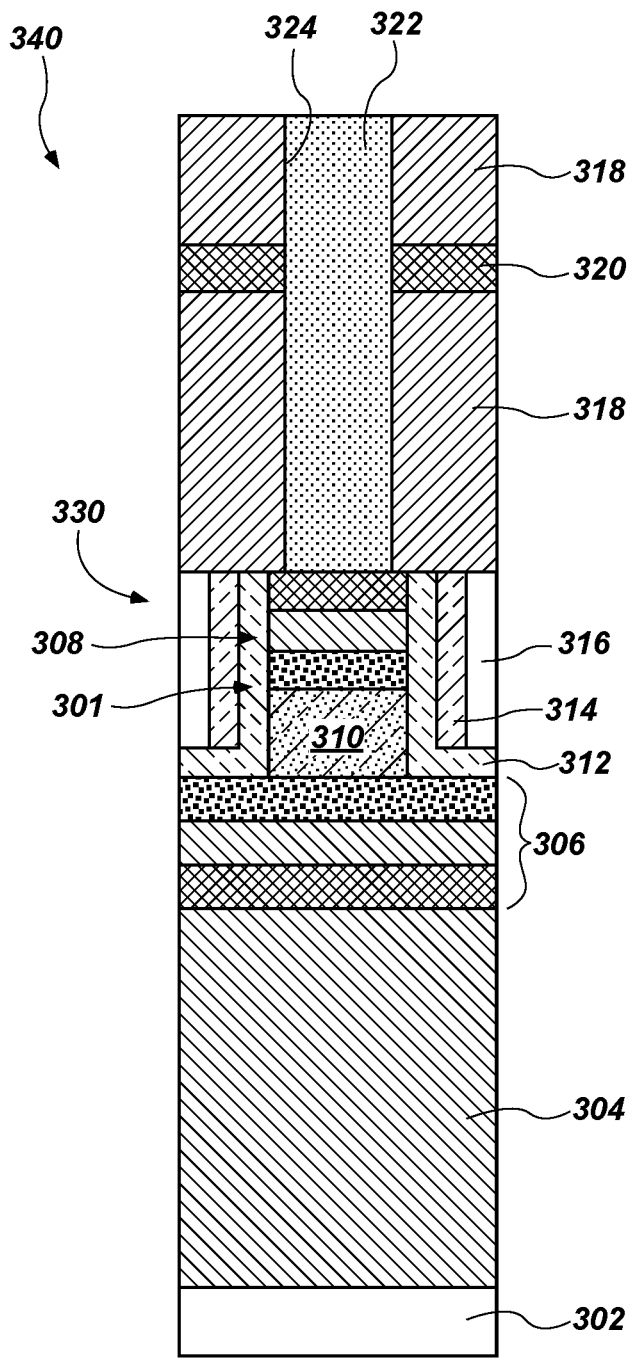

Referring next to FIG. 3G, the opening 324 may then be filled with conductive material 322 to form a semiconductor device structure 340. A conductive line structure (e.g., a source line) may subsequently be electrically coupled to the source region 308 of the vertical transistor 330 by way of the conductive material 322.

After the semiconductor device structure 340 is formed, the semiconductor device structure 340 may be subject to a hydrogen anneal process. During the hydrogen anneal process, the channel region 310 is surrounded (e.g., encapsulated) and protected against permeation of hydrogen species by the drain region 306, the source region 308, the electrically insulative material 302, and the additional electrically insulative material 320. As the drain region 306 is maintained and remains unetched in the semiconductor device structure 340, the method of forming the semiconductor device structure 340 is simplified by reducing the number of etching steps that must be performed. Further, the drain region 306 provides extended protection for the channel region 310 from hydrogen species that may diffuse through the digit line 304 and the gate dielectric material 312 during the hydrogen anneal process.

Thus, in accordance with embodiments of the disclosure, a method of fabricating a device comprises forming a stack. The stack comprises a first electrically conductive material, a second electrically conductive material that inhibits hydrogen permeation therethrough over the first electrically conductive material, a semiconductive material over the second electrically conductive material, and a third electrically conductive material that inhibits hydrogen permeation therethrough over the semiconductive material. A portion of the semiconductive material and a portion of the third electrically conductive material are selectively removed to form a semiconductive pillar comprising a remaining portion of the semiconductive material and a remaining portion of the third electrically conductive material. A gate dielectric material and a gate electrode are formed to laterally neighbor the semiconductive pillar, the gate dielectric material intervening between the gate electrode and the semiconductive pillar.

Furthermore, in accordance with embodiments of the disclosure, a device comprises a vertical transistor. The vertical transistor comprises a drain region, a pillar structure, at least one gate electrode, and a dielectric material. The drain region comprises at least one electrically conductive material that inhibits hydrogen permeation therethrough. The pillar structure comprises a source region comprising at least one additional electrically conductive material that inhibits hydrogen permeation therethrough, and a channel region comprising a semiconductive material vertically between the source region and the drain region. The at least one gate electrode laterally neighbors the channel region of the pillar structure. The dielectric material is laterally between the pillar structure and the at least one gate electrode.

Figure 4A:
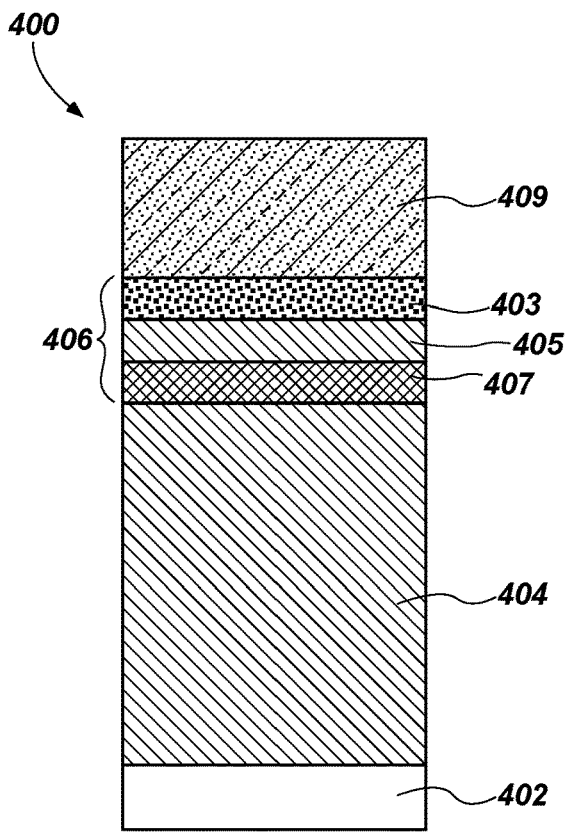
FIGS. 4A through 4I are simplified cross-sectional views illustrating various stages of another fabrication process to form a semiconductor device structure according to further embodiments of the present disclosure.

FIGS. 4A through 4I are simplified cross-sectional views illustrating various stages of a fabrication process to form a semiconductor device structure, in accordance with further embodiments of the disclosure. Referring to FIG. 4A, a stack 400 of materials including an electrically insulative material 402, a digit line 404 over the electrically insulative material 402, a drain region 406 including one or more (e.g., each) of electrically conductive barrier materials 403, 405, 407 over the digit line 404, and a semiconductive material 409 to form a channel region 410 (FIG. 4B) over the drain region 406.

Figure 4B:
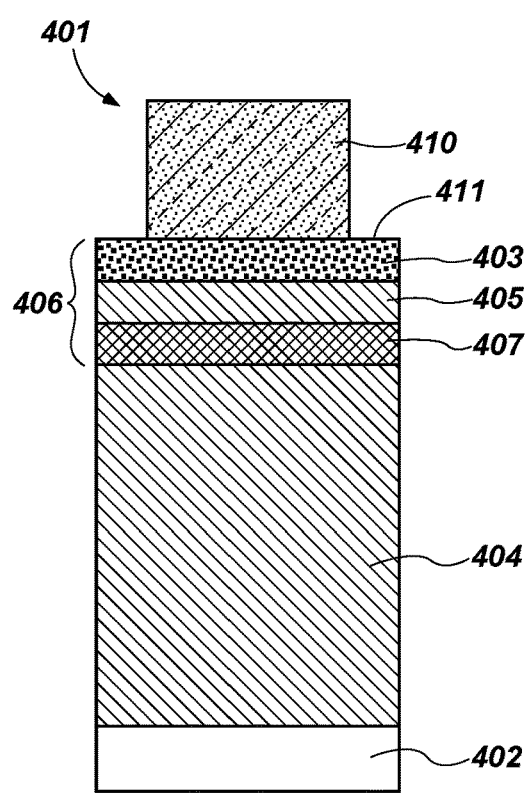

Referring to FIG. 4B, the stack 400 (FIG. 4A) is subjected to at least one material removal process (e.g., at least one etching process) to form a semiconductive pillar 401 comprising the channel region 410. As shown in FIG. 4B, the material removal process may expose at least a portion of an upper surface 411 of the drain region 406. The drain region 406 is maintained over the digit line 404 during the material removal. As shown in FIG. 4B, the digit line 404 is in electrical communication with the drain region 406, which extends continuously over the digit line 404.

Figure 4C:
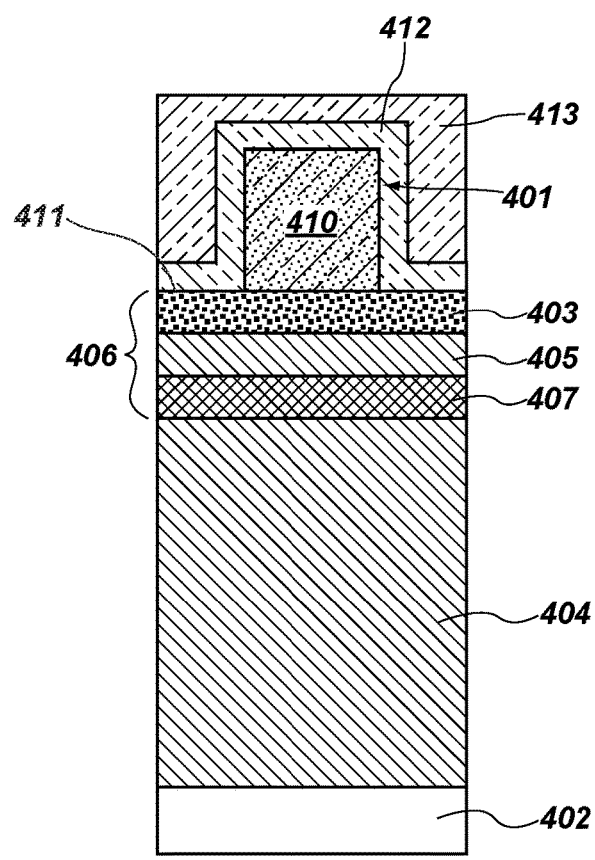

Referring next to FIG. 4C, a gate dielectric material 412 may be formed (e.g., conformally formed) over at least a portion of the upper surface 411 of the drain region 406 and surfaces (upper surfaces, side surfaces) of the semiconductive pillar 401. After forming the gate dielectric material 412, a gate electrode material 413 to become gate electrodes 414 (FIG. 4D) may be formed (e.g., conformally formed) over at least a portion of the gate dielectric material 412.

Figure 4D:
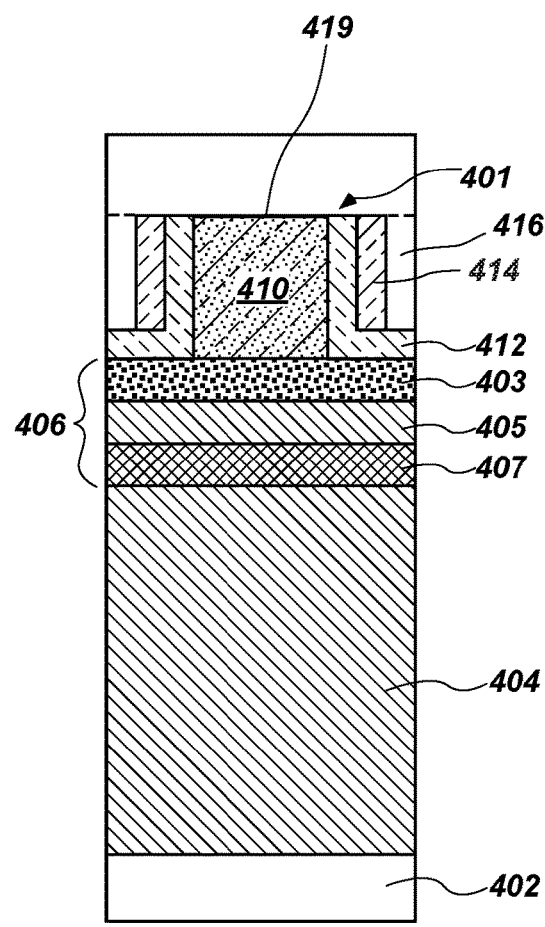

Referring next to FIG. 4D, the gate electrode material 413 (FIG. 4C) and the gate dielectric material 412 may be patterned to expose an upper surface 419 of the channel material 410 and to form the gate electrodes 414. The gate electrode material 413 and the gate dielectric material 412 may be patterned using conventional processes (e.g., CMP processes, etching processes), which are not described in detail herein.

With continued reference to FIG. 4D, an electrically insulative material 416 may be formed over the gate dielectric material 412, the gate electrodes 414, and the upper surface 419 of the semiconductive pillar 401. The electrically insulative material 416 may fill spaces between adjacent gate electrodes 414 of adjacent vertical transistors. In other embodiments, the electrically insulative material 416 is not formed over one or more upper surfaces of the gate dielectric material 412, the gate electrodes 414, and semiconductive pillar 401, as illustrated by the dashed lines in FIG. 4D.

Figure 4E:
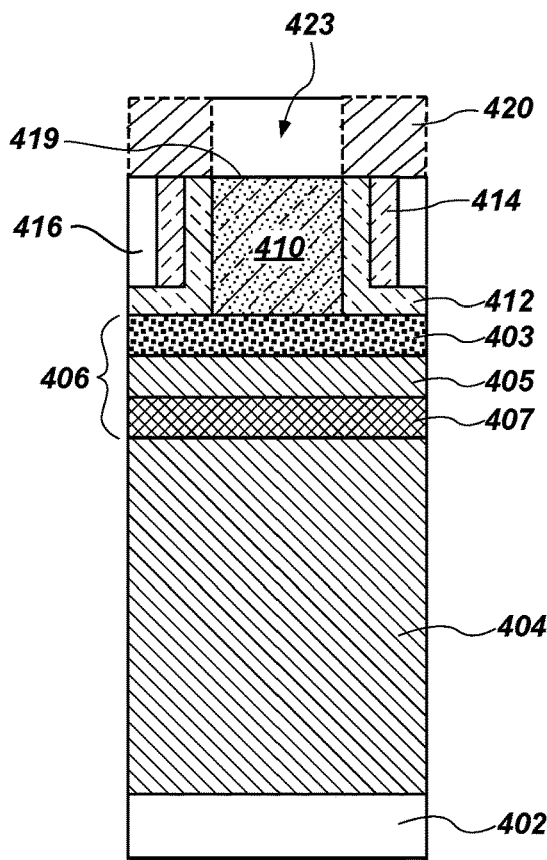

Referring next to FIG. 4E, in embodiments in which the electrically insulative material 416 is formed over the upper surface 419, a portion of the electrically insulative material 416 may be removed to form an opening 423 therein that exposes the upper surface 419 of the channel region 410. In other embodiments, an additional electrically insulative material 420 may optionally (as indicated by dashed lined) be formed over the gate dielectric material 412, the gate electrodes 414, and the semiconductive pillar 401. In such embodiments, a portion of the additional electrically insulative material 420 may be removed to form the opening 423 therein that exposes the upper surface 419 of the channel region 410.

Figure 4F:
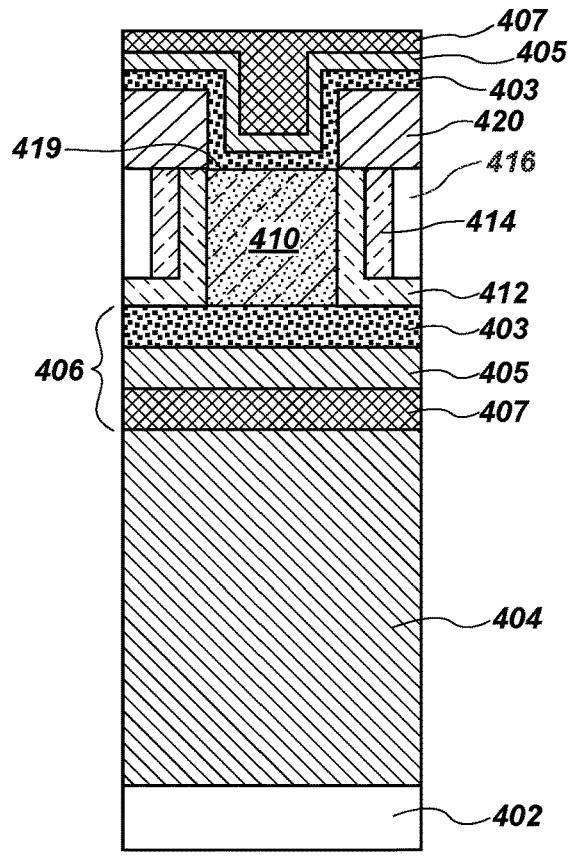

Next, as shown in FIG. 4F, one or more electrically conductive barrier materials 403, 405, 407 may be formed over the remaining portions of the electrically insulative material 416 or the remaining portions of the additional electrically insulative material 420 and over the channel region 410 within the opening 423 (FIG. 4E).

Figure 4G:
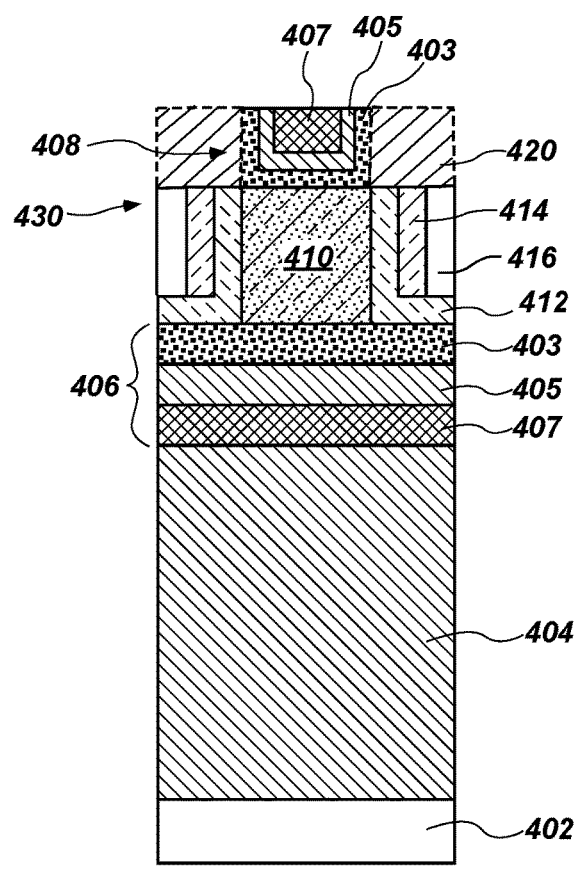

Referring next to FIG. 4G, the barrier materials 403, 405, 407 may be subject to at least one material removal process to remove at least a portion of the barrier materials 403, 405, 407 outside the opening 423 and form a source region 408. As shown in FIG. 4G, forming the source region 408 may form a vertical transistor 430 including the source region 408, the channel region 410, the drain region 406, the gate electrodes 414 laterally neighboring the channel region 410, and the gate dielectric material 412 extending between the gate electrodes 414 and each of the channel region 410 and the drain region 406.

Figure 4H:
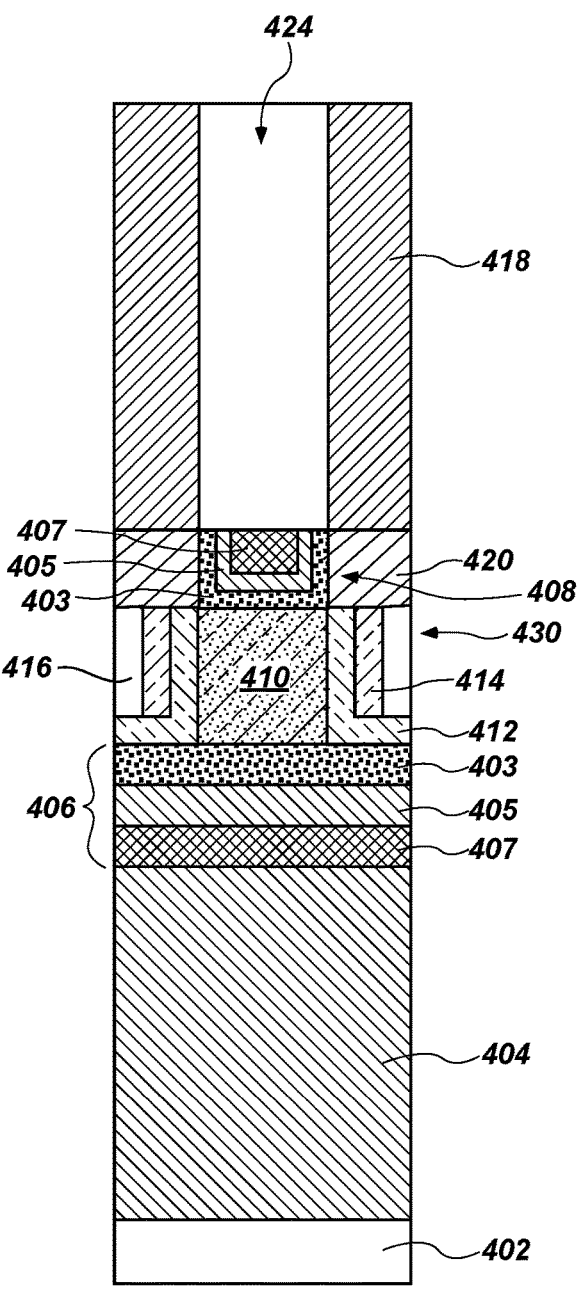

Referring next to FIG. 4H, another electrically insulative material 418 may be formed (e.g., deposited) over the vertical transistor 430 and the electrically insulative material 412, and then portions of the another electrically insulative material 418 may be selectively removed to form an opening 424.

Figure 4I:
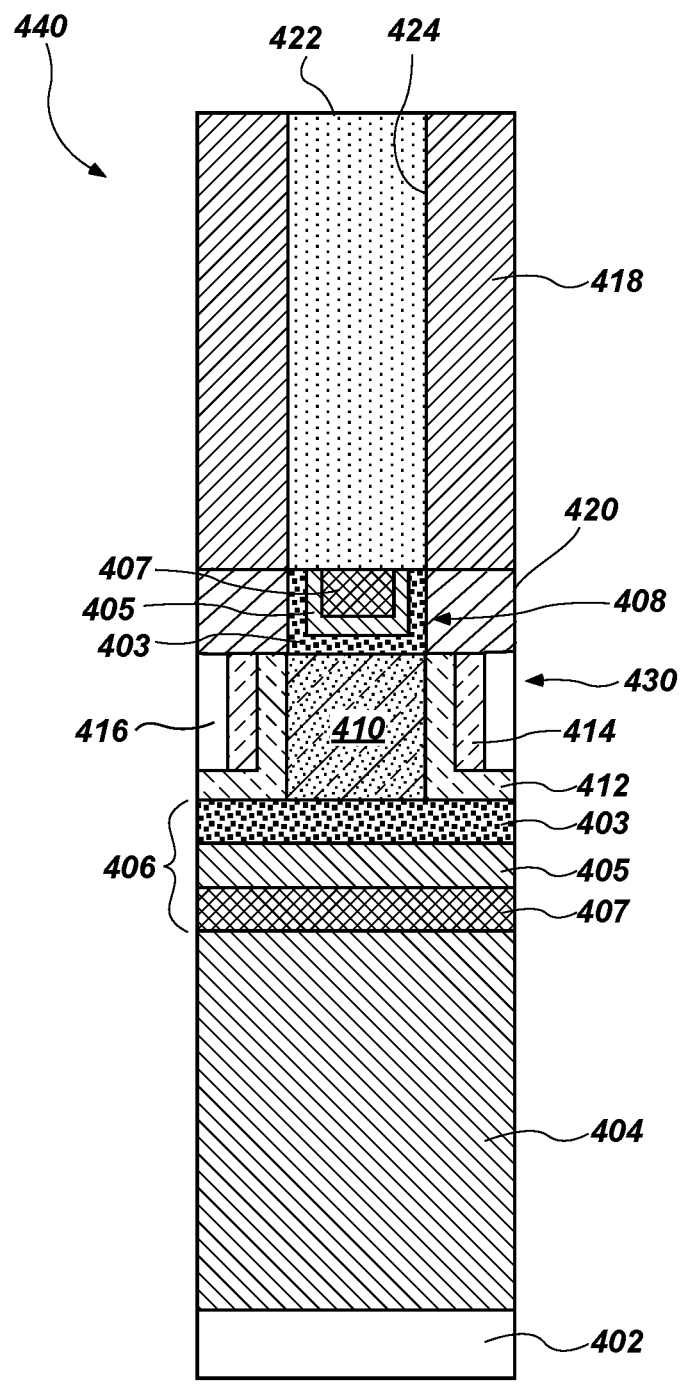

Referring next to FIG. 4I, the opening 424 (FIG. 4H) may then be filled with the conductive material 422 to form a semiconductor device structure 440. The conductive material 422 may be employed to electrically couple the source region 408 of the vertical transistor 430 to a conductive line structure (e.g., a source line).

After the semiconductor device structure 440 is formed, the semiconductor device structure 440 may be subject to a hydrogen anneal process. The channel region 410 of the vertical transistor 430 may be surrounded (e.g., encapsulated) and protected against permeation of hydrogen species by the drain region 406, the source region 408, the electrically insulative material 416, and the electrically insulative material 402. As the drain region 406 is maintained and remains unetched in the semiconductor device structure 440 and as the formation of the source region 408 does not require etching, the method of forming the semiconductor device structure 440 is simplified by reducing the number of etching steps that must be performed. Further, the drain region 406 provides extended protection for the channel material 310 from hydrogen species that may diffuse through the digit line 404 and the gate dielectric material 412 during the hydrogen anneal process.

Figure 5:
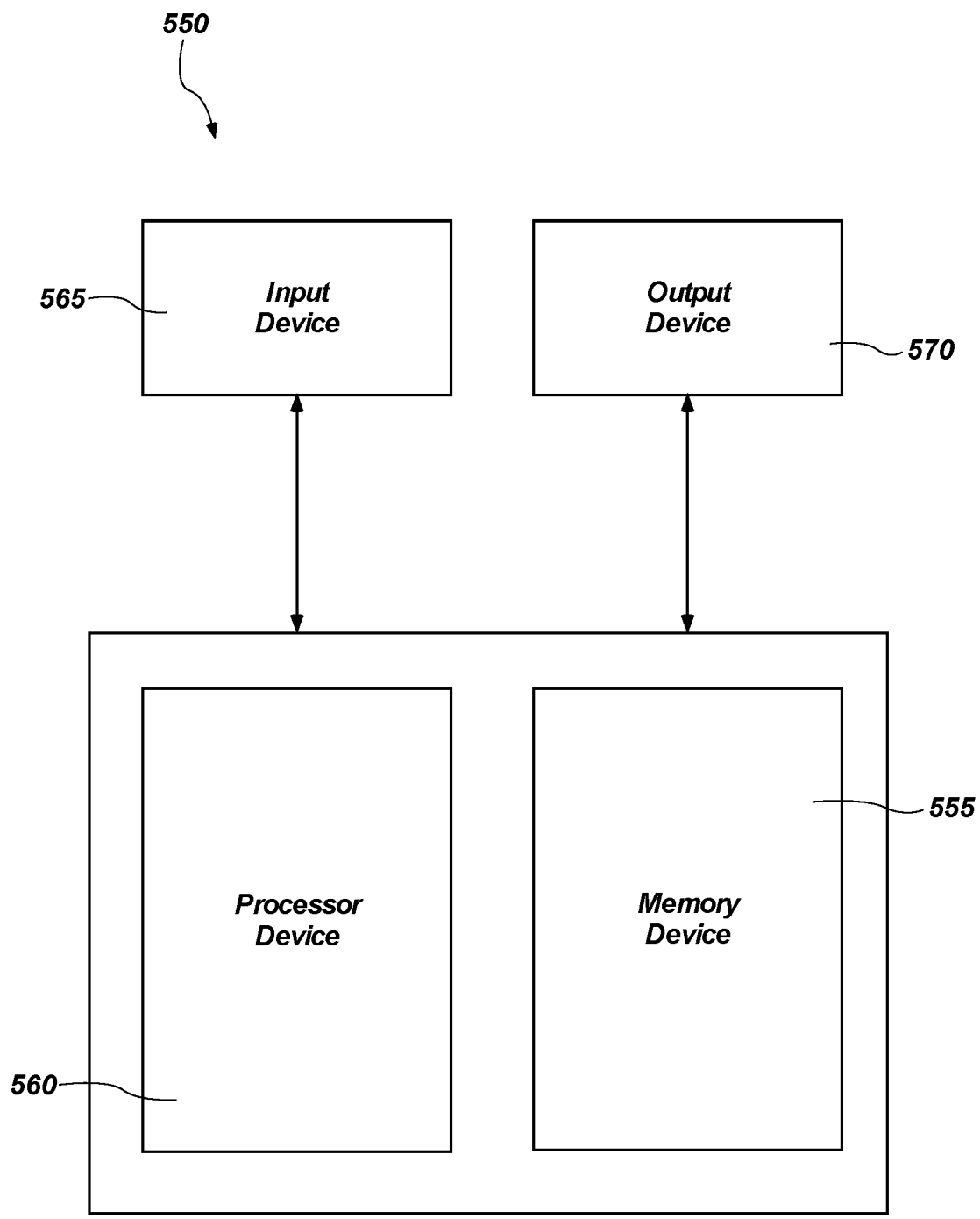
FIG. 5 is a schematic block diagram illustrating an electronic system, in accordance with embodiments of the disclosure.

Semiconductor devices including semiconductor device structures (e.g., the semiconductor device structures 140, 340, 440 previously described with reference to FIGS. 1, 3G, 4I) in accordance with embodiments of the disclosure may be used in embodiments of electronic systems of the disclosure. For example, FIG. 5 is a block diagram of an illustrative electronic system 550 according to embodiments of disclosure. The electronic system 550 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 550 includes at least one memory device 555. The at least one memory device 555 may include, for example, an embodiment including semiconductor device structures (e.g., the structures 140, 340, 440 previously described herein). The electronic system 550 may further include at least one electronic signal processor device 560 (often referred to as a "microprocessor"). The electronic system 550 may further include one or more input devices 565 for inputting information into the electronic system 550 by a user, such as, for example, a mouse or other pointing device, a keyboard, a touchpad, a button, or a control panel. The electronic system 550 may further include one or more output devices 570 for outputting information (e.g., visual or audio output) to a user such as, for example, a monitor, a display, a printer, an audio output jack, a speaker, etc. In some embodiments, the input device 565 and the output device 570 may comprise a single touchscreen device that can be used both to input information to the electronic system 550 and to output visual information to a user. The one or more input devices 565 and output devices 570 may communicate electrically with at least one of the memory device 555 and the electronic signal processor device 560.

Thus, in accordance with embodiments of the disclosure, an electronic system comprises an input device, an output device, a processor device operably coupled to the input device and the output device, and a device operably coupled to the processor device and comprising at least one transistor. The at least one transistor comprises a pillar structure, a gate electrode, and a dielectric material. The pillar structure comprises a source structure comprising at least one electrically conductive material that inhibits hydrogen permeation therethrough, a drain structure at least one additional electrically conductive material that inhibits hydrogen permeation therethrough, and a channel structure vertically between the source structure and the drain structure. The gate electrode laterally neighbors the channel structure of the pillar structure. The dielectric material is laterally between the pillar structure and the gate electrode.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A device, comprising:
a vertical transistor comprising:
a pillar structure comprising:
a source region and a drain region, the source region and the drain region having different material compositions than one another and each individually comprising at least one electrically conductive material that inhibits hydrogen permeation therethrough; and
a channel region comprising a semiconductive material vertically between the source region and the drain regions, the semiconductive material comprising indium oxide and indium gallium zinc oxide;
at least one gate electrode laterally neighboring the channel region of the pillar structure; and
a dielectric material laterally between the pillar structure and the at least one gate electrode; and
a digit line physically contacting the drain region of the vertical transistor and comprising a combination of two or more of titanium, titanium nitride, ruthenium, and tungsten.

2. The device of claim 1, wherein at least one of the source region and the drain region is heterogeneous.

3. The device of claim 1, wherein the at least one electrically conductive material of one or more of the source region and the drain region comprises one or more of elemental iridium, iridium oxide, and titanium aluminum nitride.

4. The device of claim 1, wherein the at least one electrically conductive material of one or more of the source region and the drain region comprises titanium aluminum nitride.

5. The device of claim 1, wherein the source region and the drain region each individually have a thickness within a range of from about 20 Å to about 550 Å.

6. The device of claim 1, further comprising an electrically insulative material configured to inhibit hydrogen permeation therethrough overlying at least a portion of the vertical transistor.

7. The device of claim 6, wherein the electrically insulative material comprises aluminum oxide.

8. A device, comprising:
a vertical transistor comprising:
a pillar structure comprising:
a source region and a drain region each individually comprising at least one electrically conductive material that inhibits hydrogen permeation therethrough, the at least one electrically conductive material of one or more of the source region and the drain region comprising elemental iridium and iridium oxide; and
a channel region comprising a semiconductive material vertically between the source region and the drain region;
at least one gate electrode laterally neighboring the channel region of the pillar structure; and
a dielectric material laterally between the pillar structure and the at least one gate electrode.

9. A device, comprising:
a vertical transistor comprising:
a drain region comprising at least one electrically conductive material that inhibits hydrogen permeation therethrough;
a pillar structure over the drain region and having a relatively smaller lateral area than the drain region, the pillar structure comprising:
a source region comprising at least one additional electrically conductive material that inhibits hydrogen permeation therethrough; and
a channel region having substantially the same lateral dimensions as the source region and comprising a semiconductive material vertically between the source region and the drain region;
at least one gate electrode laterally neighboring the channel region of the pillar structure; and
a dielectric material laterally between the pillar structure and the at least one gate electrode.

10. The device of claim 9, further comprising an electrically insulative material over the vertical transistor, the electrically insulative material configured to inhibit hydrogen permeation therethrough.

11. The device of claim 9, wherein the drain region extends continuously over a digit line.

12. The device of claim 9, wherein the drain region comprises a stack structure comprising elemental iridium and iridium oxide.

13. A method of fabricating a device, comprising:
forming a stack, the stack comprising:
a first electrically conductive material;
a second electrically conductive material over the first electrically conductive material, the second electrically conductive material configured to inhibit permeation of hydrogen species therethrough; and
a semiconductive material over the second electrically conductive material;
patterning at least the semiconductive material to form a pillar structure;
forming a gate dielectric material and a gate electrode to laterally neighbor the pillar structure,
the gate dielectric material intervening between the gate electrode and the pillar structure;
forming an electrically insulative material that inhibits permeation of hydrogen species therethrough over the gate dielectric material, the gate electrode, and the pillar structure;
forming an opening in the electrically insulative material to expose an upper surface of the semiconductive material of the pillar structure; and
forming a third electrically conductive material within the opening in the electrically insulative material and in physical contact with the semiconductive material of the pillar structure, the third electrically conductive material configured to inhibit permeation of hydrogen species therethrough.

14. The method of claim 13, further comprising selecting the second electrically conductive material to comprise one or more of elemental iridium, iridium oxide, and titanium aluminum nitride.

15. A method of fabricating a device, comprising:
forming a stack structure, the stack structure comprising:
a first electrically conductive material;
a second electrically conductive material that inhibits hydrogen permeation therethrough over the first electrically conductive material, wherein:
one of the one of the first electrically conductive material and the second electrically conductive material comprises titanium aluminum nitride; and the other of the first electrically conductive material and the second electrically conductive material comprises a stack of elemental iridium and iridium oxide;

a semiconductive material over the second electrically conductive material; and a third electrically conductive material that inhibits hydrogen permeation therethrough over the semiconductive material;

selectively removing a portion of the semiconductive material and a portion of the third electrically conductive material to form a semiconductive pillar comprising a remaining portion of the semiconductive material and a remaining portion of the third electrically conductive material; and forming a gate dielectric material and a gate electrode to laterally neighbor the semiconductive pillar, the gate dielectric material intervening between the gate electrode and the semiconductive pillar.

16. The method of claim 15, further comprising forming the stack structure to further comprise an electrically insulating material under the first electrically conductive material, the electrically insulating material comprising one or more of boron nitride, boron carbon nitride, silicon alumina nitride, silicon carbide, silicon carbon nitride, silicon nitride, silicon aluminum nitride, aluminum oxynitride, and aluminum oxide.

17. The method of claim 15, further comprising selecting the semiconductive material to comprise one or more of zinc tin oxide, indium zinc oxide, zinc oxide, indium gallium zinc oxide, indium gallium silicon oxide, indium oxide, tin oxide, titanium oxide, zinc oxide nitride, magnesium zinc oxide, zirconium indium zinc oxide, hafnium indium zinc oxide, tin indium zinc oxide, aluminum tin indium zinc oxide, silicon indium zinc oxide, zinc tin oxide, aluminum zinc tin oxide, gallium zinc tin oxide, zirconium zinc tin oxide, and indium gallium silicon oxide.

18. An electronic system, comprising:
an input device;
an output device;
a processor device operably coupled to the input device and the output device; and
a device operably coupled to the processor device and comprising at least one transistor comprising:
a pillar structure comprising:
a source structure comprising at least one electrically conductive material that inhibits hydrogen permeation therethrough;
a drain structure comprising at least one additional electrically conductive material that inhibits hydrogen permeation therethrough,
the at least one additional electrically conductive material of the drain structure having different material composition than at least one electrically conductive material of the source structure,
one of the at least one additional electrically conductive material of the drain structure and the at least one electrically conductive material of the source structure comprising elemental iridium and iridium oxide; and
a channel structure vertically between the source structure and the drain structure;
a gate electrode laterally neighboring the channel structure of the pillar structure; and
a dielectric material laterally between the pillar structure and the gate electrode.

* * * * *

UNITED STATES PATENT AND TRADEMARK OFFICE
CERTIFICATE OF CORRECTION

PATENT NO. : 11,658,246 B2
APPLICATION NO. : 16/596370
DATED : May 23, 2023
INVENTOR(S) : Kamal M. Karda et al.

Page 1 of 1

It is certified that error appears in the above-identified patent and that said Letters Patent is hereby corrected as shown below:

In the Specification

| | | |
|---|---|---|
| Column 4, | Line 37, | change "oxide ($In_xZn_yO_a$)," to --oxide ($In_xZn_yO_z$),-- |
| Column 5, | Line 47, | change "silicon oxynitride, another" to --silicon oxynitride), another-- |
| Column 10, | Lines 59-60, | change "channel material 410" to --channel region 410-- |
| Column 11, | Lines 41-42, | change "material 412, and" to --material 416, and-- |
| Column 11, | Lines 64-65, | change "channel material 310" to --channel region 410-- |

Signed and Sealed this
Thirty-first Day of October, 2023

Katherine Kelly Vidal
*Director of the United States Patent and Trademark Office*